United States Patent [19]

Suizu

[11] Patent Number: 5,220,684
[45] Date of Patent: Jun. 15, 1993

[54] CHANNEL SELECTING CIRCUIT

[75] Inventor: Katsuto Suizu, Fukaya, Japan

[73] Assignee: Kabushiki Kaisha Toshiba, Kanagawa, Japan

[21] Appl. No.: 644,496

[22] Filed: Jan. 23, 1991

[30] Foreign Application Priority Data

Jan. 29, 1990 [JP] Japan .................. 2-20036

[51] Int. Cl.⁵ .......................... H04B 1/26; H03L 7/06
[52] U.S. Cl. ............................. 455/183.1; 455/196.1; 455/260; 331/25
[58] Field of Search .............. 455/164.2, 165.1, 183.2, 455/192.2, 196.1, 120, 216, 260, 123, 173.1, 113, 180.3, 112, 183.1, 75, 76; 331/25

[56] References Cited

U.S. PATENT DOCUMENTS

| | | | |
|---|---|---|---|
| 4,009,439 | 2/1977 | Rast ................... | 455/180.3 |
| 4,316,151 | 2/1982 | Ooms ................. | 331/25 |
| 4,349,789 | 9/1982 | Kurihara ............. | 331/25 |
| 4,516,083 | 5/1985 | Turney . | |
| 4,521,744 | 6/1985 | Yamada et al. ....... | 331/25 |
| 4,617,520 | 10/1986 | Levine ................ | 331/25 |
| 4,631,496 | 12/1986 | Borras et al. ......... | 331/25 |
| 4,862,107 | 8/1989 | Paneth ................ | 331/25 |
| 5,018,170 | 5/1991 | Wilson ................ | 331/25 |

FOREIGN PATENT DOCUMENTS 2128056 10/1972 France .
1333534 10/1973 United Kingdom .

OTHER PUBLICATIONS

Chapman et al., "Receive IF Filter Compensation", Motorola Technical Developments, vol. 7, p. 68, Oct. (1987).

Tadashi Takeda, Patent Abstracts of Japan, vol. 8, No. 53 (E-231) [1409], Mar. 9, 1984.
Kenishi Torii, Patent Abstracts of Japan, vol. 3, No. 98 (E-131) p. 153, Aug. 18, 1987.
Tomoo Ishikawai, Patent Abstracts of Japan, vol. 6, No. 81 (E-107) [959], May 19, 1982.

*Primary Examiner*—Reinhard J. Eisenzopf
*Assistant Examiner*—Lisa Charouel
*Attorney, Agent, or Firm*—Banner, Birch, McKie & Beckett

[57] ABSTRACT

In a channel selecting circuit, there are four dividers. A first divider divides a local oscillating signal from a tuner. A second divider divides a reference output signal from a reference oscillator. A third divider divides the output from the first divider. A fourth divider divides the output from the second divider. A first controller changes the ratio of the frequency division in the first divider so as to obtain a synchronous voltage, which is supplied to the tuner, according to a selected channel. That is, the outputs from the first and the second dividers are compared by a phase comparator. The output of the phase comparator is supplied to the local oscillator of the tuner as the synchronous voltage. After the synchronous voltage becomes stable, a second controller tunes the real frequency of the broadcasting signal of the selected channel by changing the ratio of the frequency division in the first divider according to the output of a detector. This detector detects a difference between a predetermined frequency of an intermediate frequency signal. In this case, first, the outputs from the first and second dividers are compared by the phase comparator. Then, the outputs from the third and fourth dividers are compared by the phase comparator, and the output of the phase comparator is supplied to the tuner as the synchronous voltage.

24 Claims, 3 Drawing Sheets

CHANNEL SELECTING CIRCUIT

BACKGROUND OF THE INVENTION

1. Field of the Invention

The present invention relates to the field of channel selecting circuits for television signal receivers and, in particular, to a frequency synthesis circuit for use in channel selecting circuits which synthesizes a selected channel frequency quickly and efficiently.

2. Description of the Related Art

In general, a particular television signal received by an antenna is selected by use of a tuner. The received signal is amplified and detected by a video intermediate frequency (IF) circuit. The output video signal is taken from the video IF circuit and a synchronous voltage is developed to control the selection of a particular broadcast signal. A known circuit for outputting the synchronous control voltage is described below.

A PLL (phase locked loop) frequency synthesizer system is adapted for use in a channel selecting circuit of a known color television receiver. The channel selecting circuit using the PLL frequency synthesizer system has a tuner and a PLL circuit which supplies synchronous voltage for controlling a local oscillator of the tuner.

The PLL circuit has a prescaler which divides the local oscillating signal supplied from the tuner, a reference oscillator which oscillates a highly accurate signal, a first divider which divides the signal supplied from the prescaler by N, a second divider which divides the signal supplied from the reference oscillator by X, and a phase comparator which compares the phases between the outputs of the first and second dividers. The output from the phase comparator is supplied to the local oscillator of the tuner as a synchronous voltage through a filter circuit for smoothing the phase comparator output.

To be precise, the dividing ratios of the prescaler and the second divider are ⅛ and 1/512, respectively. The frequency of the known reference oscillator is 4 MHz. The output frequency fr of the second divider is then 7.8125 kHz (=4 MHz/512). The dividing ratio of the first divider is varied by control of a microcomputer.

A user orders the microcomputer to receive the desired channel through an input unit, typically a remote control. In many instances, the users may select a very high frequency channel after having viewed a very low frequency channel. Known tuning systems are slow to respond to such orders. The microcomputer changes the dividing ratio of the first divider and also changes the locked frequency of the PLL circuit. A local oscillating frequency fosc in the tuner is as follows:

$$fosc = fr.8.N$$

The minimum interval of frequency change is 62.5 kHz (=7.8125 kHz.8).

Additionally, a television broadcast signal may really be offset to the broadcast standard. This offset is discussed later.

The operation of the channel selecting circuit is described below on the condition that the intermediate frequency fo' of the broadcast signal of the received channel is offset from the standard intermediate frequency fo of the channel.

Now, if the user selects another desired channel at the time t0, that is, if the dividing ratio N of the first divider is changed by control of the microcomputer, a phase difference occurs as a result of a comparison in the phase comparator. The correction of the synchronous voltage for cancelling the phase difference is carried out every time interval tx by the phase comparator. The time interval tx for the correction is 0.128 msec (=1/7.8125 kHz), because the output frequency fr of the second divider equals 7.8125 kHz. The synchronous voltage becomes stable after the corrections of the synchronous voltage are done. After the synchronous voltage becomes stable, next, the microcomputer operates a signal retrieval so that the intermediate frequency tunes in the selected one of the broadcast.

In this case, the minimum interval of frequency change is 62.5 kHz and the intermediate frequency may not converge to the broadcast signal quickly which is at a frequency interval of 62.5 kHz. If the minimum interval of frequency change is inadequate, dividing steps of the first and second dividers have to be increased, e.g. the dividing ratio of the second divider should equal 1/1024 (then, the output frequency fr of the second divider will be 3.90625 kHz). In this case, the minimum interval of frequency change becomes 31.25 kHz. However, as the minimum interval of frequency change is decreased, the time interval for correction of the synchronous voltage increases to 0.256 msec (=1/3.90625 kHz) and the response time becomes longer. That is, when the channel selected is changed, the time t1 until the synchronous voltage becomes stable is longer. When the microcomputer retrieves a real broadcasting signal so that the intermediate frequency f0 tunes in the real intermediate frequency f0' of the broadcasting signal, the response time until the tuning is completed increases too.

SUMMARY OF THE INVENTION

Accordingly, it is an object of the present invention to provide an improved channel selecting circuit which desirably shortens the response time and minimizes the minimum frequency change interval.

In accordance with the present invention, the foregoing object is achieved by providing a frequency synthesizer circuit for use in controlling the frequency of a local oscillator of a tuning circuit, the frequency synthesizer circuit comprising a processor controlling a phase locked loop, the frequency synthesizer circuit characterized by switch means, responsive to the processor, for switching a control signal generated by dividing the output of the local oscillator and a control signal generated by dividing the output of a reference oscillator and a phase comparator for comparing the phases of the outputs of the switch means.

In accordance with another aspect of the present invention, the above-stated object is achieved by providing a channel selecting circuit which comprises a tuner for converting a high frequency signal to an intermediate frequency signal by mixing the high frequency signal with a local oscillating signal controlled by a synchronous voltage, an AFT detector for detecting a difference between the frequency of the intermediate frequency signal and a predetermined frequency, a first divider for dividing the local oscillating signal of the tuner, a reference oscillator for outputting a reference signal, a second divider for dividing the reference signal from the reference oscillator, a third divider for dividing the output from the first divider, a fourth divider for dividing the output from the second divider, a first switch for selecting the output from the first divider or the third divider, a second switch for selecting the output from the second divider or the fourth divider, a phase comparator for comparting the output from the first switch with the output from the second switch, a supply circuit for supplying the output from the phase comparator to the tuner as the synchronous voltage, a channel input circuit for inputting a selected channel, a first controller for changing the ratio of the frequency division in the first divider to output a synchronous voltage according to the selected channel from the supply circuit and connecting the first and the second switch to the first and the second divider, respectively until the synchronous voltage from the supply circuit becomes stable, and a second controller for tuning to the real frequency of the broadcasting signal of the selected channel by changing the ratio of the frequency division in the first divider according to the output of the detector after the synchronous voltage becomes stable and connecting the first and second switches to the third and the fourth dividers from the first and second dividers, respectively, during the tuning.

BRIEF DESCRIPTION OF THE DRAWINGS

A more complete appreciation of the present invention and many of its attendant advantages will be readily obtained by reference to the following detailed description considered in connection with the accompanying drawings, in which.

DETAILED DESCRIPTION OF THE PREFERRED EMBODIMENT

The preferred embodiment of the present invention will now be described in more detail with reference to the accompanying drawings.

Figure 1:
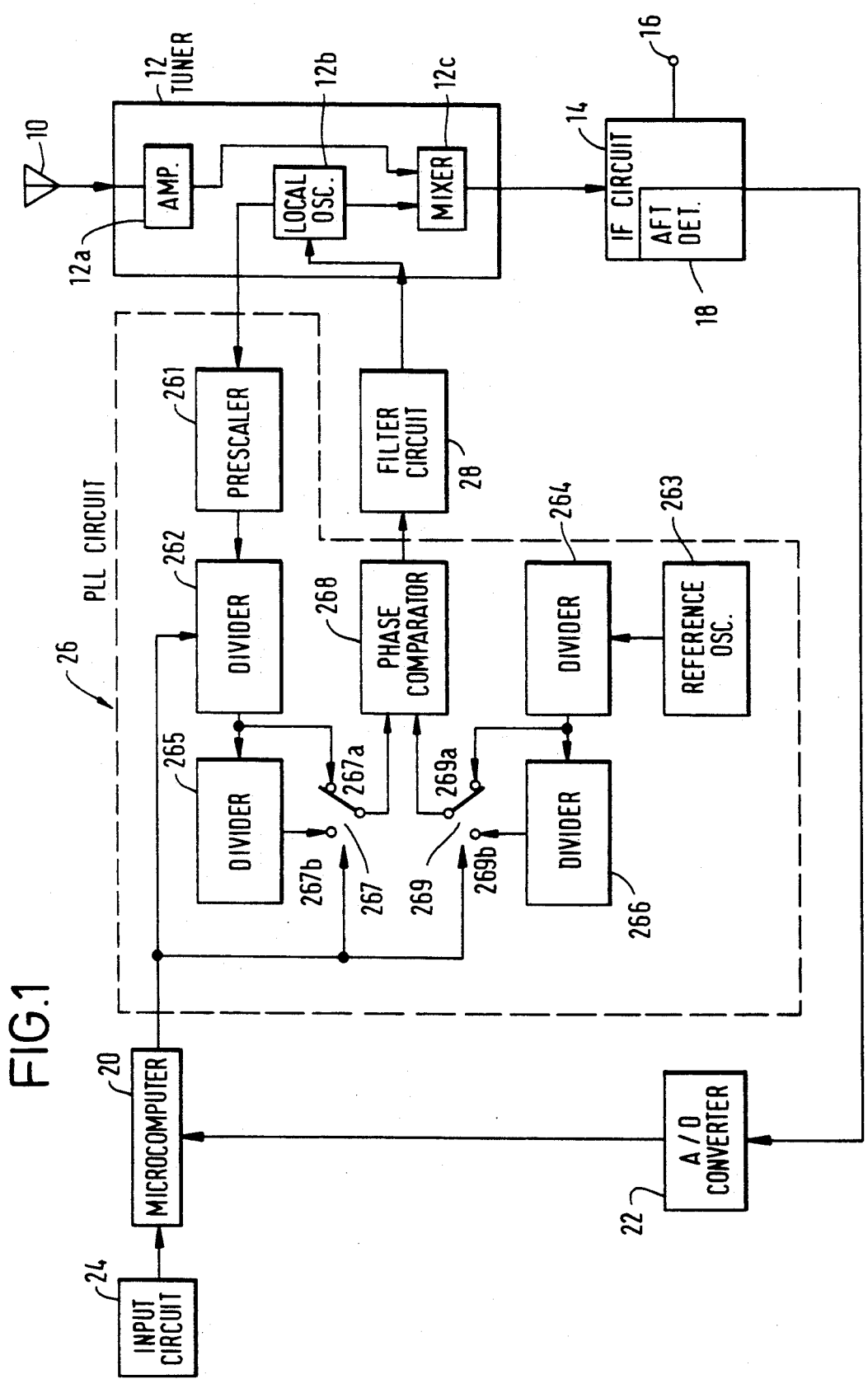
FIG. 1 provides a block diagram of a channel selecting circuit according to the present invention.

FIG. 1 is a block diagram of a channel selecting circuit of one embodiment of the invention.

An antenna 10 receives a broad band television signal. A tuner 12 is connected to the antenna 10 and has an amplifier 12a, a local oscillator 12b and a mixer 12c. The tuner 12 selects a channel from the broad band television signal. A video intermediate frequency (IF) circuit 14 is connected to the tuner 12. The circuit 14 connected to the output terminal 16 outputs the video signal. The circuit 14 has a AFT (automatic fine tuning) detector 18 which detects the difference between the real video intermediate frequency and the standard frequency. That is, there may exist a case when there is a difference between the real video intermediate frequency and the broadcasting standard (frequency). The AFT detector 18 is used for detecting the difference. The AFT detector 18 is known and the circuit 14 including the AFT detector 18 is supplied by, for example, Toshiba Corporation as an IC whose model number is TA7607.

Figure 2:
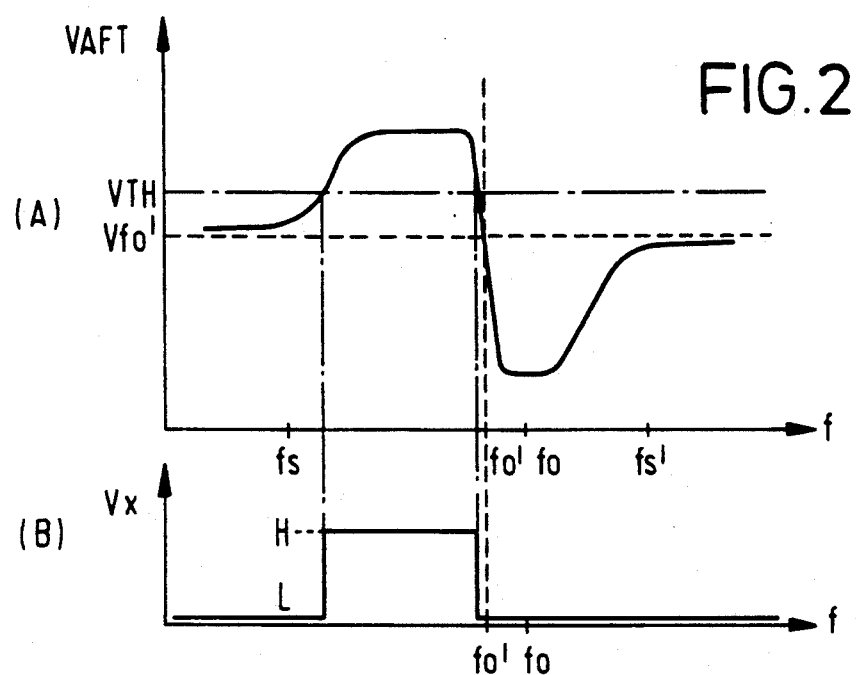
FIG. 2 illustrates a characteristic of the AFT signal from the AFT detector of the channel selecting circuit shown in FIG. 1.

FIG. 2 illustrates a characteristic of the AFT signal from the AFT detector of the channel selecting circuit shown in FIG. 1. In FIG. 2, f0, f0' means a broadcasting standard (intermediate frequency) and the real intermediate frequency of the broadcasting signal, respectively. The AFT voltage is higher than the center voltage Vf0' in response to a center frequency f0' when the intermediate frequency approaches the center frequency f0' from the lower frequency than the frequency fo' by sweeping the local oscillating frequency of the local oscillator 12b. The AFT voltage becomes lower than the center voltage Vf0' when the intermediate frequency passes and becomes higher than the center frequency f0'. The change of the AFT voltage shows the position of the frequency f0', namely the state of offset of he broadcasting signal.

A data processor 20 which most conveniently comprises a microcomputer is connected to the circuit 14 through an A/D converter 22. This A/D converter 22 converts the analogue AFT signal from the AFT detector 18 of the video IF circuit 14 to a digital signal. The output of the A/D converter 22 is shown in FIG. 2(B), where a threshold level of the A/D converter 22 is VTH. An input circuit 24 is connected to the data processor 20 and the input circuit 24 is operated by a user to select the channel. There are a PLL circuit block 26 and a filter circuit 28 between the data processor 20 and the tuner 12. That is, a prescaler 261 is connected to the local oscillator 12b of the tuner 12. The dividing ratio of the prescaler 261 is ¼.

A first divider 262 is connected to the prescaler 261. A reference oscillator 263 oscillates a 4 MHz signal, and is connected to a second divider 264. A third and a fourth divider 265, 266 are connected to the first and the second dividers 262, 264, respectively. The dividing ratios of the second, third and fourth dividers 264, 265, 266 are set at 1/512, ½, and ½, respectively. The dividing ratio of the first divider 262 is variable by the data processor 20. Each of the first, second, third and fourth dividers may comprises, for example, a counter.

A first switch 267 has two input terminals 267a, 267b which are connected to the first and the third dividers 262, 265, respectively. Its output is connected to one input of a phase comparator 268. A second switch 269 also has two input terminals 269a, 269b which are connected to the second and the fourth dividers 264, 266, respectively. Its output is connected to a second input of the phase comparator 268. These switches 267, 269 are controlled by the data processor 20.

The phase comparator 268 is connected to the first and second switches 267, 269. This comparator 268 compares the outputs of the switches 267, 269. A filter circuit 28 which most conveniently comprises a low pass filter is connected between the phase comparator 268 and a control terminal of the local oscillator 12b of the tuner 12. This filter circuit smooths the output of the phase comparator 268 and obtains a direct current voltage.

The operation of the channel selecting circuit is described below by using FIGS. 3 and 4.

Now, let us suppose that another television channel is selected by a user of the input circuit 24 at the time t0.

The data processor 20 changes the dividing ratio N of the first divider 262 at the time t0. As a result, a phase difference occurs between the phases at the input terminals of the phase comparator 268. On the difference between the two phases, the synchronous voltage response to the designated channel is output from the phase comparator 268. In this time (after time t0), the data processor 20 controls the switches 267, 269 to first select the input terminals 267a, 268a, respectively. The comparator 268 compares the output of the first divider 262 with the output of the second divider 264.

The change of the synchronous voltage during the correction process is shown in FIG. 3(A). The correction of the synchronous voltage is done every predetermined time interval tx (tx=0.128 msec=512/4 MHz=1/7.8125 KHz) by the phase comparator 268.

This time interval for correction is comparatively short according to the dividing outputs from the first and second dividers 262, 264. Namely, the correction is carried out at a high speed by a large interval of frequency change under the small dividing steps. And the synchronous voltage becomes stable before the time t1. The time t1 is, for example, 100 msec, from the time t0.

Returning now to FIG. 3(B), after the synchronous voltage became stable (after the time t1' where t1' f t1: t1' is, for example, 200 msec, and is decided with adequate time in relation to the time t1), the data processor 20 changes the dividing ratio N again in response to the AFT signal from the video intermediate frequency circuit 14 and retrieves the broadcasting signal so that the local oscillator 12b tunes in the real broadcast signal. This signal retrieval is shown as a process from time t1' to t5 through t2, t3, t4 in FIG. 3(B). From time t1' to t3, switches 267, 269 are connected to the terminals 267a and 269a, respectively, as well as before time t1' (from time t0 to t1').

When the data processor 20 detects that the intermediate frequency will converge to the real signal frequency fo' from the change of the AFT signal (namely, when the time is now at t3), the microcomputer 20 controls the switches 267 and 269 to be connected to the terminals 267b and 269b, respectively. Thus, the correction of the synchronous voltage is carried out at low speed by a smaller interval of frequency change under the large dividing steps. Namely, from time t3 to t5, the correction of the synchronous voltage is slow; however, the interval of frequency change is small. And the intermediate frequency converges closer to the frequency f0'. The locking in to the broadcasting signal is further discussed in greater detail below using the flow chart of FIG. 4.

Figure 3:
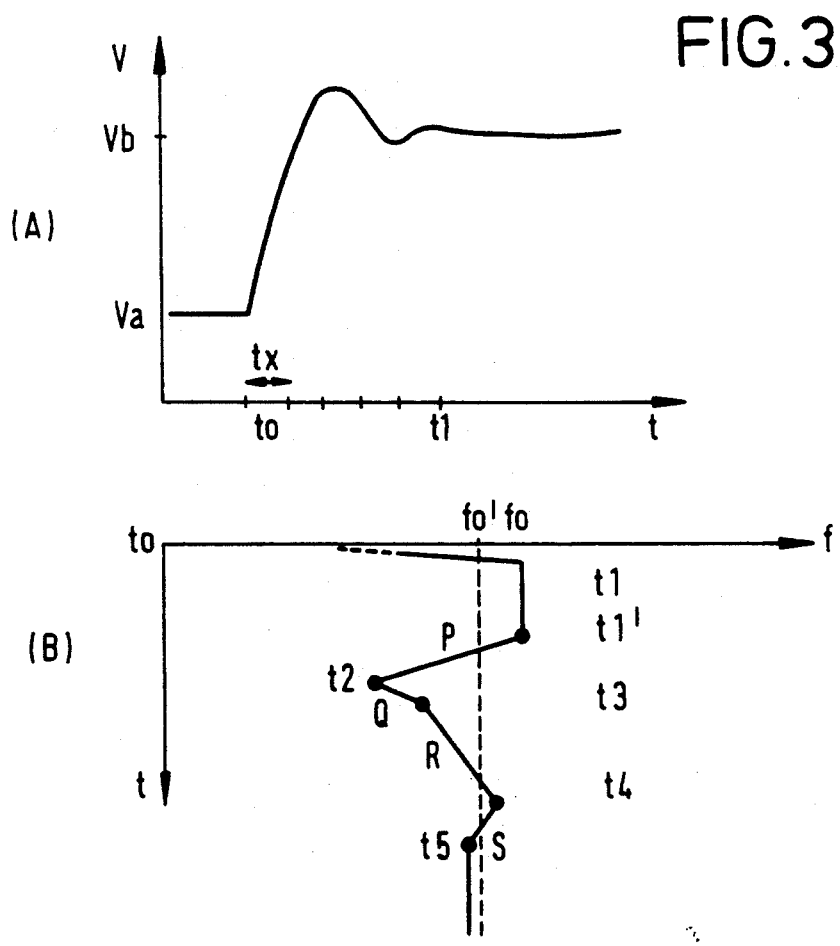
FIG. 3 illustrates a change of frequency in a process of channel selecting in the channel selecting circuit shown in FIG. 1.
Figure 4:
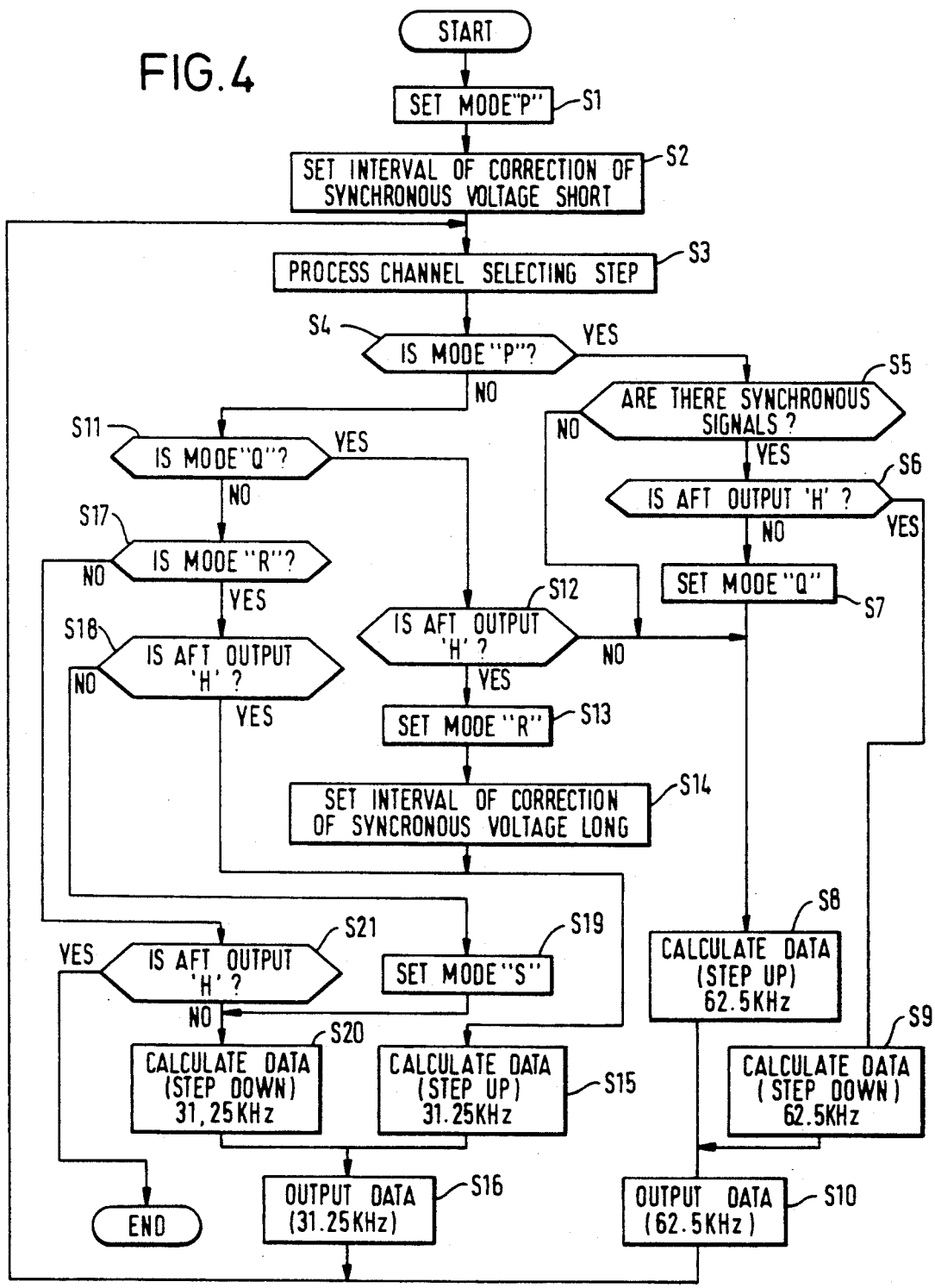
FIG. 4 is a flow chart illustrating the operation of the data processor shown in FIG. 1.

The flow chart of FIG. 4 begins once there has been a first pass through the PLL circuit 26 and the tuning frequency of the local oscillator 12b is within a range, for example, fo—fo' (FIG. 2) or time t1 of FIG. 3 is reached. Referring now to FIG. 4, after the synchronous voltage becomes stable (time t1' in FIG. 3(B)), a mode is set to "P" in step S1. The mode hereinafter means the direction, and the speed in retrieval of the broadcasting signal refers to frequency. Next, the time interval of correction of the synchronous voltage for the retrieval is set. A short time interval of correction is set first. That is, the switches 267 and 269 are connected to the terminals 267a, 269a, respectively (step S2). The data processor 20 changes the dividing ratio N, when it processes the channel selecting step (step S3).

The data processor 20 recognizes whether the mode is set to "P" (step S4). If the mode is "P", the data processor 20 recognizes whether there are any horizontal synchronous signals retrievable from the incoming television signal (step S5). Horizontal synchronous signals are obtained from the receiving signal when the intermediate frequency f is positioned between fs and fs' (see FIG. 2). If some horizontal synchronous signals are detected (that is, a broadcasting signal is captured or received and the horizontal signal is obtained), the data processor 20 recognizes whether AFT output is 'H' (high level) (step S6). If AFT output becomes 'L' (low level) by the above process (that is, if the answer is no), the step moves to step S7. That is, the mode is set to "Q". This means that a change of a retrieval direction is accomplished. Thus, in step S8, the new data is calculated for the step up in frequency. In this case, data processor 20 changes the dividing ratio of the divider 262 so as to increase the frequency of local oscillator 12b.

In step S5, if there is no synchronous signals detected, the data processor 20 calculates the new data for the step up in frequency which is stepped up by 62.5 kHz (step 8). In step S6, if the AFT output is maintained as 'H' (that is, if the answer is yes), the data processor 20 calculates the new data for the step down in frequency (step S9). In this case, the direction of the frequency change is towards frequency decrease.

The data calculated in step S8 or S9 outputs (in step S10) from the data processor 20 to control the divider 262.

If the mode was set to "Q" in step S7, in step S4 of the next passage through the flow chart, the output of step S4 moves to step S11 and to step S12 from step S11, because the mode is now "Q".

In step S12, the microcomputer judges whether the AFT output is 'H'. If the AFT output is not 'H' (this means that the intermediate frequency is not close to that of broadcasting signal fo'), the flow moves to step S8 mentioned above. If the AFT output is 'H' (this means that the intermediate frequency becomes closer to that of broadcasting signal, fo' from the lower frequency than fo'), the mode is set to mode "R" (step S13). That is, after this point (time t3), the time interval of correction of the synchronous voltage becomes longer (step S14). Then, flow moves to step S15, S16. The data processor 20 calculates a new intermediate frequency which is stepped up by 31.25 kHz (step S15) and outputs data (step S16). That is, the interval of frequency change becomes small.

If the mode was set to "R" in step S13, flow moves to step S18 from S4, S11, and S17 in sequence. Then at step S18, the data processor 20 judges whether the AFT output is 'H'. If the intermediate frequency does not become greater than the intermediate frequency fo' of the real broadcasting signal, the AFT output is maintained as 'H'. Thus, if the answer to step S18 is yes, flow moves to step S15 to increase the intermediate frequency more.

If the intermediate frequency becomes greater than the intermediate frequency fo' of the real broadcasting signal, the AFT output decreases (becomes 'L') (see FIG. 2). Thus, if the answer to step S18 is no, the mode is set to "S" (to reverse the direction from the mode "R") (step S19). Then, the data processor 20 calculates new data for the next frequency to retrieve (step S20) and outputs data (step S16).

If the mode was set to "S" in step S19, the flow moves to step S21 from S4, S11, and S17 in sequence on the next pass through the loop. The data processor 20 judges whether the AFT output is 'H' (step S21). The AFT output changes to a high voltage when the intermediate frequency reaches the intermediate frequency fo' of the broadcasting signal. If the AFT output becomes 'H', then, frequency retrieval is stopped (step END). If the AFT output does not increase, the data processor 20 calculates a new intermediate frequency which is stepped down by 31.25 kHz (step S20) and outputs data (step S16). Of course, the pass through the loop continues until the "end" step is reached in this case.

Thus, there has been shown and described a first phase locking process using a first divide ration to obtain a first level of locking to a real broadcast signal followed by a second phase locking process using a second divide ratio to obtain a greater degree of locking. While the process is organized into two overall steps, the overall process operates more quickly and efficiently than obtaining lock using only a single divide ratio.

What is claimed is:

1. A frequency synthesizer circuit for use in controlling the frequency of an output of a local oscillator in a tuning circuit, the frequency synthesizer circuit comprising:

a controller for generating a control signal;

switch means, responsive to the control signal and receiving first and second frequency divided oscillation signals and first and second frequency divided reference signals, for switching between one of the first and second frequency divided oscillation signals and between one of the first and second frequency divided reference signals to output a frequency divided local oscillation signal and a frequency divided reference signal, the first and second frequency divided oscillation signals being generated by dividing the frequency of the output of the local oscillator and the first and second frequency divided reference signals being generated by dividing the frequency of an output of a reference oscillator; and a phase comparator for comparing the phases of the frequency divided local oscillation signal and the frequency divided reference signal.

2. A frequency synthesizer circuit as claimed in claim 1, further comprising:

a first divider for generating the first frequency divided oscillation signal; and a second divider for generating the second frequency divided oscillation signal.

3. A frequency synthesizer circuit as claimed in claim 2, wherein the first divider is coupled to the output of the local oscillator.

4. A channel selecting circuit comprising:

a tuner for converting a high frequency signal to an intermediate frequency signal by mixing the high frequency signal with a local oscillation signal, said tuner comprising a local oscillator for generating the local oscillation signal;

a detector for detecting a difference between a frequency of the intermediate frequency signal and a predetermined frequency to produce a difference signal;

a first divider for dividing a signal proportional to the local oscillation signal to produce a first divided oscillation signal;

a reference oscillator for outputting a reference oscillation signal;

a second divider for dividing the reference oscillation signal from the reference oscillator to produce a first divided reference signal;

a third divider for dividing the first divided oscillation signal from the first divider to produce a second divided oscillation signal;

a fourth divider for dividing the first divded reference signal from the second divider to produce a second divided reference signal;

a first switch, coupled to the first divider and the third divider, having a first position for outputting the first divided oscillation signal and a second position for outputting the second divided oscillation signal for providing either the first or second divided oscillation signal as an output;

a second switch, coupled to the second divider and the fourth divider, having a first position for outputting the first divided reference signal and a second position for outputting the second divided reference signal for providing either the first or second divided reference signal as an output;

a phase comparator for comparing the phase of the output from the first switch with the phase of the output from the second switch to produce a comparison signal;

a supply circuit for supplying the comparison signal from the phase comparator to the tuner as a synchronous voltage for control of the local oscillator;

a channel input circuit for inputting a selected channel;

a first controller for changing the divisor of the first divider so that the first divided oscillation signal corresponds to the selected channel from the channel input circuit and for controlling said first and second switches to their first positions so as to output the first divided oscillation signal and the first divided reference signal, respectively, to said phase comparator until the synchronous voltage from the supply circuit becomes stable; and a second controller for changing the divisor of the first divider according to the difference signal of the detector after the synchronous voltage becomes stable and for controlling the first and second switches to their second positions so as to output the second divided oscillation signal and the second divided reference signal to said phase comparator, thereby tuning the local oscillator to the frequency of an intermediate frequency signal of the selected channel.

5. A channel selecting circuit claimed in claim 4, wherein the supply circuit comprises a filter circuit for smoothing the output from the phase comparator.

6. A channel selecting circuit claimed in claim 4, wherein each of the dividers comprises of a counter.

7. A channel selecting circuit claimed in claim 4, wherein the first and second controllers comprise a microprocessor.

8. A method of controlling the frequency of a local oscillator of a tuning circuit comprising the steps of:

dividing the frequency of an output of the local oscillator to produce a first and a second frequency divided oscillator signal;

dividing the frequency of an output of a reference oscillator to produce a first and a second frequency divided reference signal;

switching either the or the second frequency divided oscillator signals and either the first or the second frequency divided reference signals to a phase comparator in response to a control signal; and comparing the phases of the switched signals.

9. A method of controlling the frequency of a local oscillator of a tuning circuit as claimed in claim 8, further comprising the step of switching the other one of the first and second frequency divided oscillator signals and the other one of the first second frequency divided reference signals to the phase comparator upon the occurrence of a predetermined event.

10. A control circuit for controlling a frequency of a local oscillator signal comprising:
- a controller for generating first and second control signals;
- a frequency divider circuit, receiving the local oscillator signal, for dividing the frequency of the local oscillator signal by a factor determined from the first control signal to produce a first oscillation signal and for generating a second oscillation signal, the frequency of the second oscillation signal being a multiple of the frequency of the first oscillation signal;
- a reference oscillation generating circuit for generating first and second reference oscillation signals, the frequency of the second reference oscillation signal being a multiple of the frequency of the first reference oscillation signal;
- a switching circuit, coupled to said frequency divider circuit and said reference oscillation generating circuit, for outputting either the first oscillation signal and the first reference oscillation signal or the second oscillation signal and the second reference oscillation signal in response to the second control signal; and
- a phase comparator, receiving the output of said switching circuit, for outputting a local oscillator frequency control signal.

11. A control circuit for controlling a frequency of a local oscillator signal according to claim 10, wherein said frequency divider circuit comprises a first divider, responsive to the first control signal, for producing the first oscillation signal, and a second divider for dividing the first oscillation signal to generate the second oscillation signal.

12. A control circuit for controlling a frequency of a local oscillator signal according to claim 11, wherein said reference oscillation generating circuit comprises a reference oscillator for generating a reference signal, a first divider for dividing the frequency of the reference signal to generate the first reference oscillation signal, and a second divider for dividing the first reference oscillation signal to generate the second reference oscillation signal.

13. A control circuit for controlling a frequency of a local oscillator signal according to claim 10, wherein said reference oscillation generating circuit comprises a reference oscillator for generating a reference signal, a first divider for dividing the frequency of the reference signal to generate the first reference oscillation signal, and a second divider for dividing the first reference oscillation signal to generate the second reference oscillation signal.

14. A channel selecting circuit comprising:
- a tuner for generating an intermediate frequency signal from a channel of a broadband signal, said tuner comprising a local oscillator for generating a local oscillator signal;
- a detector circuit for detecting the difference between a frequency of the intermediate frequency signal and a predetermined frequency signal to produce a difference signal;
- a frequency divider circuit for dividing a frequency of the local oscillator signal by a divisor determined from a first control signal to produce a first oscillation signal and for generating a second oscillation signal, a frequency of the second oscillation signal being proportional to a frequency of the first oscillation signal;
- a reference oscillation generating circuit for generating first and second reference oscillation signals, a frequency of the second reference oscillation signal being proportional to a frequency of the first reference oscillation signal;
- a switching circuit, coupled to said frequency divider circuit and said reference oscillation generating circuit, for outputting either the first oscillation signal and the first reference oscillation signal or the second oscillation signal and the second reference oscillation signal in response to a second control signal;
- means for generating a local oscillator frequency control signal from the output of said switching circuit;
- a channel selection input circuit for selecting a particular channel of the broadband signal; and
- a controller for generating the first control signal for controlling said frequency divider circuit and the second control signal for controlling said switching circuit in accordance with the difference signal and the particular channel selected.

15. A channel selecting circuit according to claim 14, wherein said frequency divider circuit comprises a first divider, responsive to the first control signal, for producing the first oscillation signal, and a second divider for dividing the first oscillation signal to generate the second oscillation signal.

16. A channel selecting circuit according to claim 15, wherein said reference oscillation generating circuit comprises a reference oscillator for generating a reference signal, a first divider for dividing the frequency of the reference signal to generate the first reference oscillation signal, and a second divider for dividing the first reference oscillation signal to generate the second reference oscillation signal.

17. A channel selecting circuit according to claim 16, wherein said controller comprises means, responsive to said particular channel selected, for generating the first control signal for controlling the first divider to divide the frequency of the local oscillator by a first divisor and for generating the second control signal for controlling the switching circuit to output the first oscillation signal and the first reference oscillation signal.

18. A channel selecting circuit according to claim 17, wherein said controller further comprises means, responsive to the difference signal produced by said detector circuit, for generating the first control signal for controlling the first divider to divide the frequency of the local oscillator by a second divisor after the local oscillator frequency control signal has become stable and for generating the second control signal for controlling the switching circuit to output the first oscillation signal and the first reference oscillation signal.

19. A channel selecting circuit according to claim 18, wherein said controller further comprises means, responsive to the difference signal produced by said detector circuit, for generating the second control signal for controlling the switching circuit to output the second oscillation signal and the second reference oscillation signal.

20. A channel selecting circuit according to claim 19, wherein said detector circuit comprises an automatic fine tuning detector.

21. A channel selecting circuit according to claim 14, wherein said reference oscillation generating circuit comprises a reference oscillator for generating a reference signal, a first divider for dividing the frequency of the reference signal to generate the first reference oscillation signal, and a second divider for dividing the first reference oscillation signal to generate the second reference oscillation signal.

22. A channel selecting circuit according to claim 14, wherein said controller comprises means, responsive to said particular channel selected, for generating the first control signal for controlling the first divider to divide the frequency of the local oscillator by a first divisor and for generating the second control signal for controlling the switching circuit to output the first oscillation signal and the first reference oscillation signal.

23. A channel selecting circuit according to claim 22, wherein said controller further comprises means, responsive to the difference signal produced by said detector circuit, for generating the first control signal for controlling the first divider to divide the frequency of the local oscillator by a second divisor after the local oscillator frequency control signal has become stable and for generating the second control signal for controlling the switching circuit to output the first oscillation signal and the first reference oscillation signal.

24. A channel selecting circuit according to claim 23, wherein said controller further comprises means, responsive to the difference signal produced by said detector circuit, for generating the second control signal for controlling the switching circuit to output the second oscillation signal and the second reference oscillation signal.

* * * * *